United States Patent [19]
Nishimura et al.

[11] Patent Number: 6,103,556
[45] Date of Patent: Aug. 15, 2000

[54] THIN-FILM TRANSISTOR AND METHOD OF MANUFACTURING THE SAME

[75] Inventors: Hisayuki Nishimura; Shigeto Maegawa; Shigenobu Maeda, all of Hyogo, Japan

[73] Assignees: Mitsubishi Denki Kabushiki Kaisha, Tokyo; Ryoden Semiconductor System Engineering Corporation, Hyogo, both of Japan

[21] Appl. No.: 09/228,234

[22] Filed: Jan. 11, 1999

Related U.S. Application Data

[62] Division of application No. 09/004,169, Jan. 2, 1998, Pat. No. 5,885,858, which is a continuation of application No. 08/440,594, May 15, 1995, abandoned, which is a division of application No. 08/198,058, Feb. 18, 1994, Pat. No. 5,440,168.

[30] Foreign Application Priority Data

| Feb. 22, 1993 | [JP] | Japan | 5-31811 |
| Nov. 26, 1993 | [JP] | Japan | 5-296592 |

[51] Int. Cl.$^7$ .............................. H01L 21/00; H01L 21/31
[52] U.S. Cl. .......................... 438/149; 438/158; 438/763
[58] Field of Search .................... 438/149, 158, 438/763, 770, 775, 923, 287

[56] References Cited

U.S. PATENT DOCUMENTS

| 4,520,380 | 5/1985 | Ovshinsky et al. . |
| 4,624,737 | 11/1986 | Shimbo . |
| 5,198,379 | 3/1993 | Adan . |
| 5,382,533 | 1/1995 | Ahmad et al. ............ 437/24 |
| 5,541,128 | 7/1996 | Kwasnick et al. . |
| 5,571,734 | 11/1996 | Tseng et al. ............ 437/40 |
| 5,712,208 | 1/1998 | Tseng et al. ............ 438/770 |

FOREIGN PATENT DOCUMENTS

| 60-136259 | 7/1985 | Japan . |
| 61-214475 | 9/1986 | Japan . |
| 62-216368 | 9/1987 | Japan . |
| 1-276671 | 11/1989 | Japan . |
| 2-45932 | 2/1990 | Japan . |
| 2-87519 | 3/1990 | Japan . |
| 2-109359 | 4/1990 | Japan . |
| 2-304962 | 12/1990 | Japan . |
| 4-109623 | 4/1992 | Japan . |
| 5-47726 | 2/1993 | Japan . |
| 5-82549 | 4/1993 | Japan . |

OTHER PUBLICATIONS

H. Kitajima et al., "Leakage Current Reduction in Sub–Micron Channel Poly–Si TFT's", Extended Abstracts of the 1991 International Conference on Solid State Devices and Materials, Yokohama, Aug. 27–19, 1991, pp. 174–176.

Peter J. Wright et al., "The Effect of Fluorine in Silicon Dioxide Gate Dielectrics", IEEE Transaction on Electron Devices, vol. 36, No. 5, May 1989, pp. 879–889.

S. Maeda et al., "Negative Bias Temperature Instability in Poly–Si TFT's", 1993 VLSI Symposium, pp. 29–30, Month Unknown.

Kousuke Okuyama et al., "Water–Related Threshold Voltage Instability of Polysilicon TFT's", Okuyama et al., IEDM 93, pp. 527–530.

S. M. Sze, VLSI Technology Second Edition, 1988, pp. 261–263, Month Unknown.

*Primary Examiner*—Amir Zarabian
*Assistant Examiner*—Michael S. Lebentritt
*Attorney, Agent, or Firm*—McDermott, Will & Emery

[57] ABSTRACT

A thin-film transistor (3, 5a, 5b and 5c) is covered with a first silicon nitride film (9) formed by an LPCVD method. A first silicon oxide film (6) is formed on the first silicon nitride film (9). A silicon nitride film (7), i.e., passivation film which is formed by a plasma CVD method is provided on the first silicon oxide film (6).

2 Claims, 19 Drawing Sheets

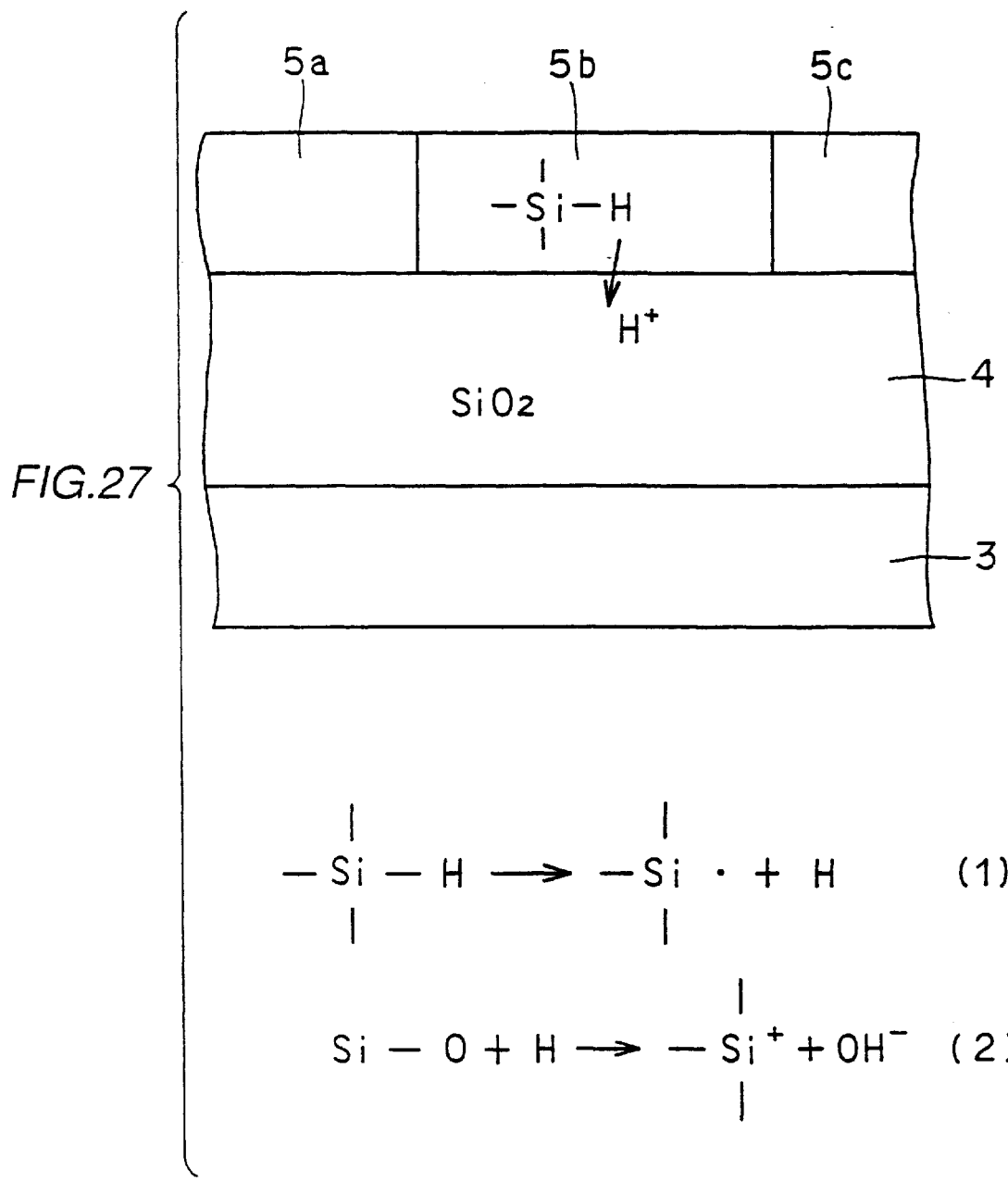

THIN-FILM TRANSISTOR AND METHOD OF MANUFACTURING THE SAME

This application is a divisional of application Ser. No. 09/004,169 filed Jan. 2. 1998, now U.S. Pat. No. 5,885,858 which is a continuation of application Ser. No. 08/440,594 filed May 15, 1995 now abandoned, which is a division of application Ser. No. 08/198,058 filed Feb. 18. 1994, now U.S. Pat. No. 5,440,168.

BACKGROUND OF THE INVENTION

1. Field of the Invention

The present invention relates in general to a thin-film transistor, and in particular, to a thin-film transistor for the use in an LSI and a liquid crystal display (LCD).

2. Description of the Related Art

FIG. 22 is a cross section of a conventional thin-film transistor (which will be referred to as a "TFT" hereinafter) disclosed, for example, in Japanese Patent Laying-Open No. 60-136259. An insulating film 2 is provided on a substrate 1. A gate electrode 3 is provided on the insulating film 2. The gate electrode 3 is covered with a gate insulating film 4 provided on the insulating film 2. On the substrate 1, there is also provided a channel polysilicon layer 5 covering a gate electrode 3 with a gate insulating film 4 therebetween. The channel polysilicon layer 5 is divided into a source region 5a, an active layer 5b forming a channel region and a drain region 5c. The gate electrode 3, source region 5a, channel region (5b) and drain region 5c form the TFT. The channel polysilicon layer 5 is covered with a silicon oxide film 6 provided on the substrate 1. On the silicon oxide film 6, there is provided a plasma silicon nitride film 7 which has a thickness of 0.5 μm to 1.0 μm and is formed by a plasma chemical vapor deposition method (which will be refereed to as a "plasma CVD method"). The plasma silicon nitride film 7 is used as a protection film of the TFT, and is produced using dichlorosilane and ammonia.

Now, function of the plasma silicon nitride film will be described below. As already described, a major purpose of the plasma silicon nitride film 7 is to provide a protection film of the TFT. However, it is formed by the plasma CVD method, so that a large amount of hydrogen is contained in the film. As a result, the hydrogen passes through the silicon oxide film 6 and enters the active layer 5b of the TFT due to the anneal processing effected after the formation of film. Thereby, dangling bonds which exist in the polysilicon forming the active layer 5b are sealed with hydrogen atoms as shown in FIG. 24, resulting in reduction of the dangling bonds, i.e., in hydrogenation. As a result, the TFT can have preferable characteristics in which an off-current (condition of $V_d<0$ and $V_g=0$) of the TFT is reduced and an on-current (condition of $V_g=V_d<0$) is increased.

Then, a bias high-temperature stress test which was carried out for evaluating reliability will be described below. In the bias high-temperature test (which will be referred to simply as "BT stress"), heat and bias are applied to the gate electrode, and a load against the device is determined. More specifically, a degree of change of the characteristics relating to the drain current and the gate voltage is determined. The result is shown in FIG. 25. Referring to FIG. 25, the BT stress causes $V_{th}$. (threshold voltage) to change negatively and thus the on-current decreases. FIG. 26 shows a result obtained by comparison between two kinds of TFTs, i.e., the TFT in which hydrogenation has been caused by hydrogen coming from the plasma silicon nitride film 7 and the TFT in which hydrogen has not been caused. As can be seen from FIG. 26, $V_{th}$ changes to a larger extent in the TFT in which hydrogenation has been caused. From this, it can be considered that the change of $V_{th}$. is caused by such a mechanism that Si—H bonds in the active layer 5b of the TFT are dissociated to form an interface level as represented by formula (1) in FIG. 27, and further the hydrogen produced thereby reacts with oxygen atoms in the gate oxide film 4 as represented by formula (2), producing fixed positive charges at the interface.

In the conventional TFT, as described above, the polysilicon in the active layer, ie., channel is hydrogenated owing to provision of the plasma silicon nitride film 7, so that the TFT has good characteristics that the off-current is reduced and the on-current is increased. However, the BT stress may change the characteristics to a large extent, so that a high reliability for a long term may not be obtained.

SUMMARY OF THE INVENTION

Accordingly, it is an object of the invention to provide a thin-film transistor, overcoming the above-noted disadvantages, in which a high reliability for a long term can be obtained without deteriorating characteristics of the thin-film transistor.

Another object of the invention is to provided a method of manufacturing such a thin-film transistor.

A thin-film transistor according to a first aspect of the invention includes a substrate. A gate electrode is provided on the substrate. A gate insulting film covering the gate electrode is provided on the substrate. A semiconductor layer covering the gate electrode with the gate insulating film therebetween is provided on the substrate. The semiconductor layer includes an active layer forming a channel as well as a source region and a drain region located at opposite sides of the active layer. A first silicon nitride film is provided on the semiconductor layer. A first silicon oxide film is provided on the first silicon nitride film. A second silicon nitride film is provided on the first silicon oxide film. A quantity of hydrogen contained in the first silicon nitride film is smaller than that of hydrogen contained in the second silicon nitride film.

A thin-film transistor according to a second aspect of the invention includes a substrate. A gate electrode is provided on the substrate. A gate insulting film covering the gate electrode is provided on the substrate. A semiconductor layer covering the gate electrode with the gate insulating film therebetween is provided on the substrate. The semiconductor layer includes an active layer forming a channel as well as a source region and a drain region located at opposite sides of the active layer. A quantity of fluorine contained in the active layer is smaller than that of fluorine contained in the gate electrode.

A thin-film transistor according to a third aspect of the invention includes a substrate. A gate electrode is provided on the substrate. A gate insulting film covering the gate electrode is provided on the substrate. A semiconductor layer covering the gate electrode with the gate insulating film therebetween is provided on the substrate. The semiconductor layer includes an active layer forming a channel as well as a source region and a drain region located at opposite sides of the active layer. A portion of the active layer near the drain region contains more fluorine than a central portion of the active layer.

In a method of manufacturing a thin-film transistor according to a fourth aspect of the invention, a gate electrode is first formed on a substrate. A gate insulating film is formed on the substrate to cover the gate electrode. A semiconductor layer is formed to cover the gate electrode with the gate insulating film therebetween. The semiconductor layer includes an active layer forming a channel as well as a source region and a drain region located at opposite sides of the active layer. A first silicon nitride film is formed on the semiconductor layer by a low pressure chemical vapor deposition method (which will be referred to as an "LPCVD" method). A first silicon oxide film is formed on the first silicon nitride film. A second silicon nitride film is formed on the first silicon oxide film by a plasma CVD method.

In a method of manufacturing a thin-film transistor according to a fifth aspect of the invention, a gate electrode is formed on a substrate. A gate insulating film is formed on the substrate to cover the gate electrode. An active layer forming a channel is formed on the gate insulating film. Fluorine is implanted into the gate electrode. The gate electrode into which the fluorine is implanted is thermally processed to diffuse the fluorine into the active layer.

According to the thin-film transistor of the first aspect of the invention, the amount of hydrogen contained in the first silicon nitride film is smaller than that of hydrogen contained in the second silicon nitride film. This first silicon nitride film is formed by the LPCVD method, and the second silicon nitride film is formed by the plasma CVD method. In contrast to the property of the plasma silicon nitride film, the silicon nitride film formed by the LPCVD method contains scarcely any hydrogen atom and does not easily pass the hydrogen atom therethrough. Therefore, even if hydrogen contained in the second silicon nitride film moves toward the active layer, the hydrogen is interrupted by the first silicon nitride film, so that the amount of hydrogen entering the active layer is controlled.

According to the thin-film transistor of the second aspect of the invention, the amount of fluorine contained in the active layer is smaller than that of fluorine contained in the gate electrode. This structure is formed by the method in which the fluorine is implanted into the gate electrode, and thereafter the implanted fluorine is thermally diffused into the active layer. Since the fluorine is not implanted directly into the active layer in this method, the active layer is not damaged.

Since dangling bonds of silicon in the active layer are sealed with the fluorine, the Si—H bond does not generate even if hydrogen diffuses toward the active layer.

According to the thin-film transistor of the third aspect of the invention, since the fluorine is implanted into the portion of the active layer near the drain region, dangling bonds of silicon at the drain end in the active layer are sealed, and thus the off-current is reduced.

According to the method of manufacturing the thin-film transistor of the fourth aspect of the invention, the first silicon nitride film is formed on the semiconductor layer by the LPCVD method. The silicon nitride film formed by the LPCVD method has such a property that it contains scarcely any hydrogen atom and does not easily pass the hydrogen atom therethrough.

According to the method of manufacturing the thin-film transistor of the fifth aspect of the invention, the fluorine is implanted into the gate electrode, and thereafter the gate electrode into which the fluorine is implanted is thermally treated to diffuse the fluorine into the active layer. Since the fluorine is not implanted directly into the active layer, the active later containing the fluorine is obtained without damaging the active layer.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 27 is a cross section showing a state where an interface level and a fixed charge appear at an interface between a silicon oxide film and an active layer.

DESCRIPTION OF THE PREFERRED EMBODIMENT

Embodiment 1

Figure 1:
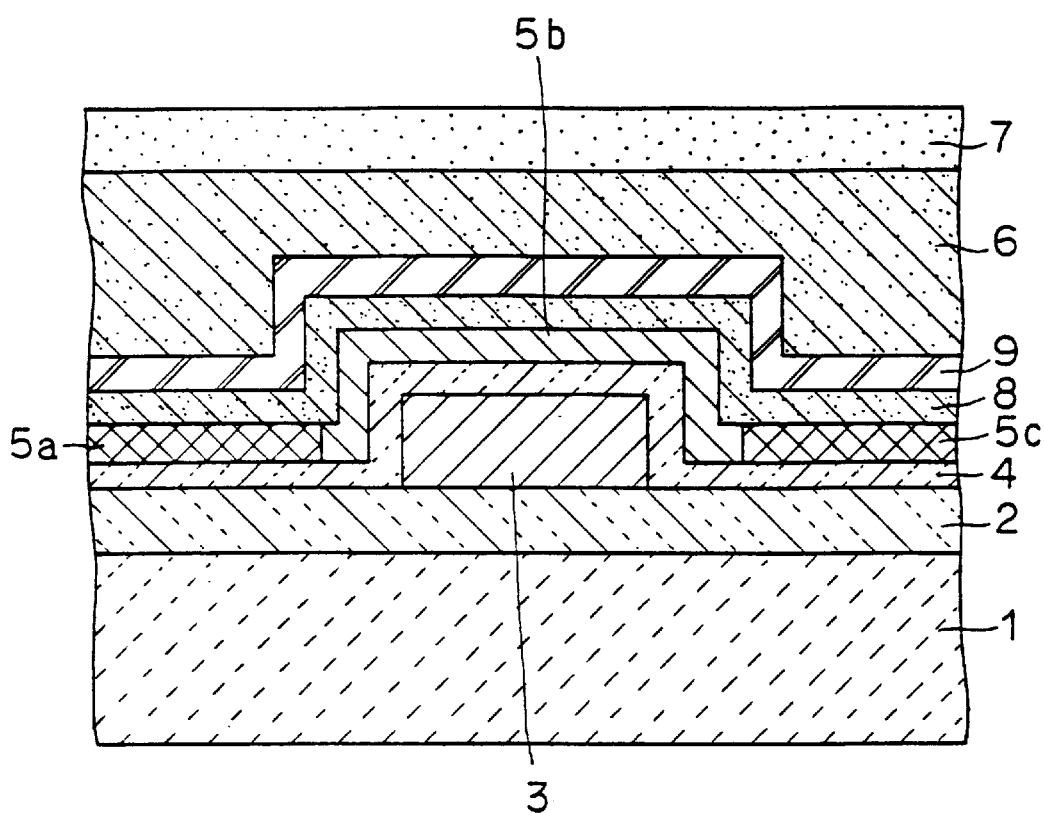
FIG. 1 is a cross section of a thin-film transistor of an embodiment of the invention.
Figure 2:
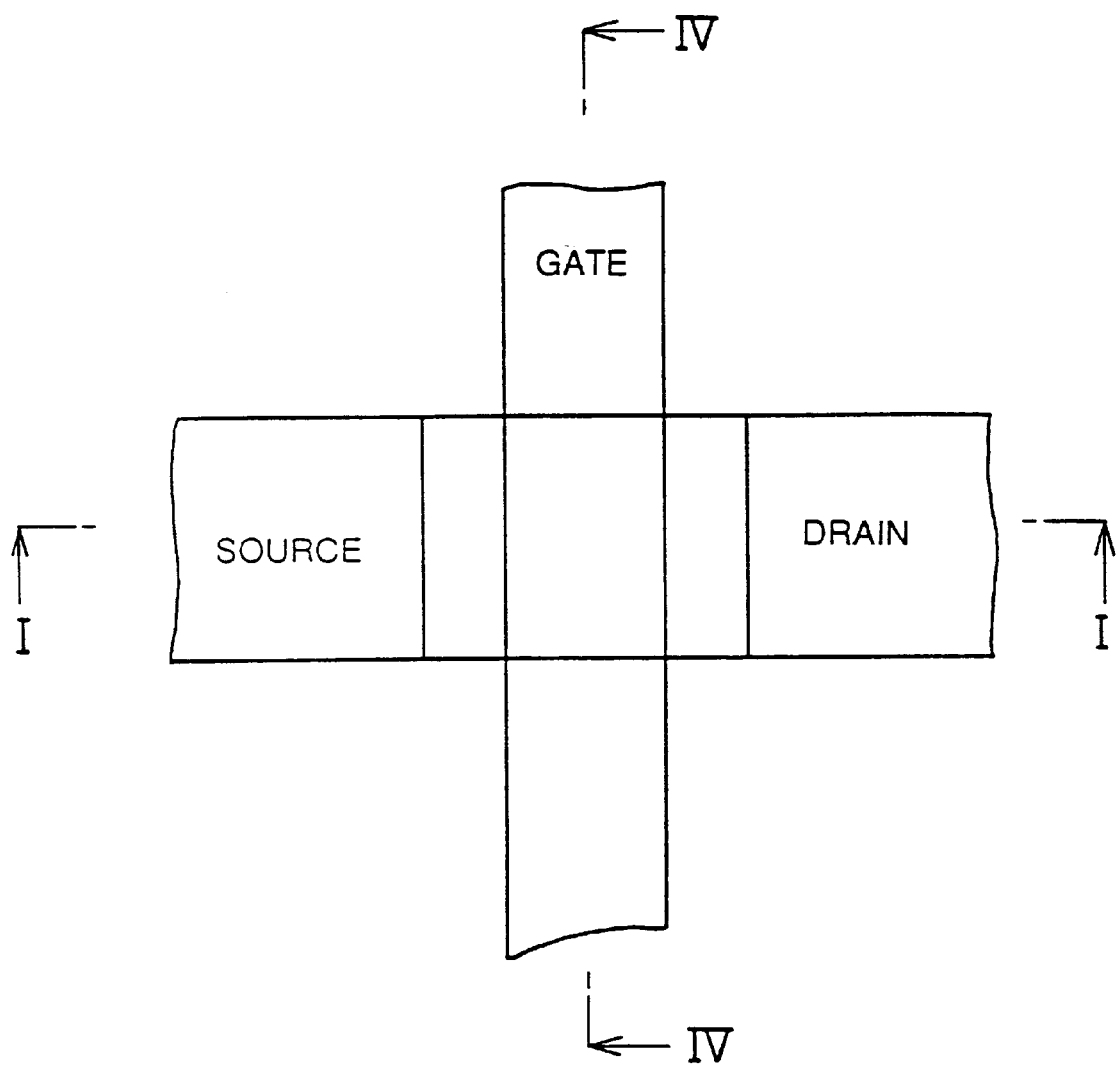
FIG. 2 is a plan of the thin-film transistor shown in FIG. 1.

FIG. 1 is a cross section of a TFT according to an embodiment of the invention. FIG. 2 is a plan of the same. The cross section of FIG. 1 is taken along line I—I in FIG. 2.

Referring to FIG. 1, an insulating film 2 is provided on a substrate 1. A gate electrode 3 is provided on the insulating film 2. The gate electrode 3 is made of polysilicon. The gate electrode 3 is covered with the gate insulating film 4 provided on the substrate 1. On the substrate 1, there is also provided a channel polysilicon layer 5 which is a semiconductor layer and covers the gate electrode 3 with the gate insulating film 4 therebetween. The channel polysilicon layer 5 includes an active layer 5b forming a channel as well as a source region 5a and a drain region 5c located at opposite sides of the active layer 5b. The channel polysilicon layer 5 is covered with a first silicon nitride film 9 formed on the substrate 1 by the LPCVD method. The first silicon nitride film 9 is covered with a first silicon oxide film 6 provided on the substrate 1. A second silicon nitride film 7 is provided on the first silicon oxide film 6 formed by the plasma CVD method. The second silicon nitride film 7 is a passivation film. In the device of this embodiment, a second silicon oxide film 8 is provided between the first silicon nitride film 9 and the semiconductor layer 5.

Then, the first silicon nitride film 9 will be described below in detail. The first silicon nitride film 9 is formed at a temperature of 700 to 800° C. by the LPCVD method. In contrast to a silicon nitride film formed by the plasma CVD method, and particularly, to the second silicon nitride film 7 formed by the plasma, the silicon nitride film formed by the LPCVD method has the property that it contains scarcely any hydrogen atom and does not easily pass the hydrogen atom therethrough. By providing the first silicon nitride film 9 having such a property between the second silicon nitride film 7 and the active layer 5b, it is possible to control the quantity of hydrogen atoms diffusing from the second silicon nitride film 7 into the active layer 5b. The quantity of hydrogen atoms entering the active layer 5b can be controlled to a certain extent also by changing the thickness of the second silicon nitride film which is a supply source of hydrogen atoms. However, the major purpose of the second silicon nitride film 7 is to form a protection film for protecting the TFT, and thus the thickness thereof can be reduced only to a limited extent. Therefore, it is impossible to change the thickness of the second silicon nitride film 7 to such an extent that achieves both the intended characteristics and sufficient reliability of the TFT.

Figure 3:
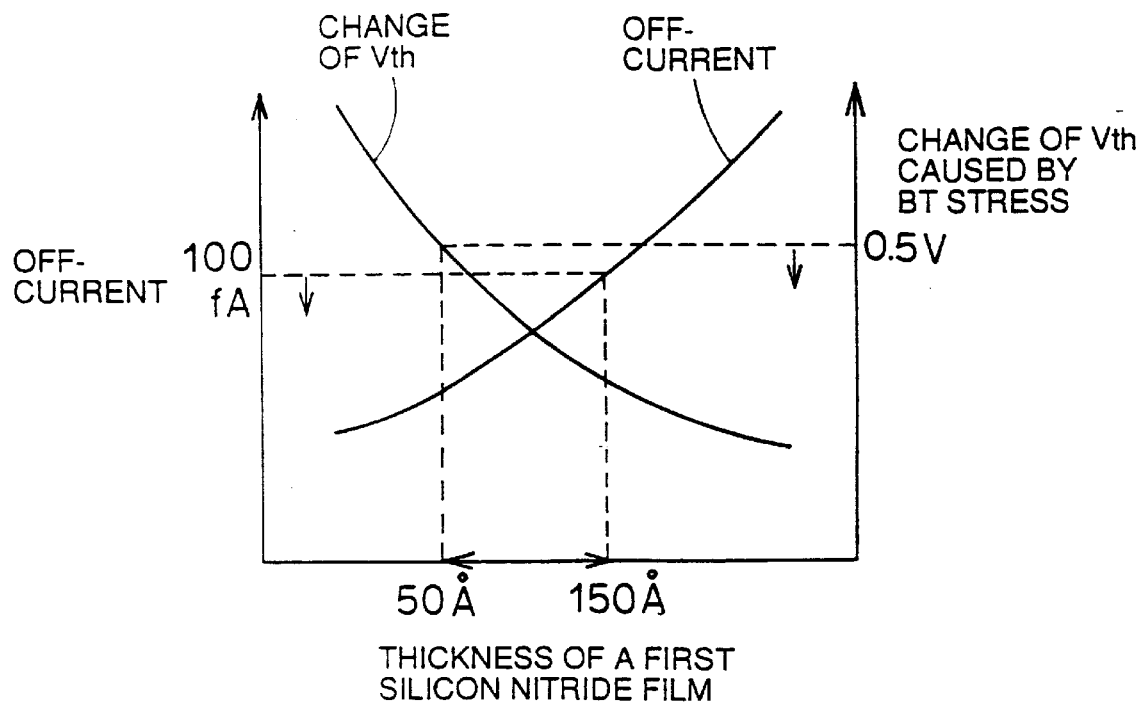
FIG. 3 shows a relationship between a thickness of a first silicon nitride film and change of $V_{th}$ caused by a BT stress or an off-current.

The thickness of the first silicon nitride film 9 will be described below. As shown in FIG. 3, if the first silicon nitride film 9 is thin, hydrogen coming through the first silicon nitride film 7 largely attains hydrogenating effect, as is done in the prior art. In this case, the off-current is sufficiently small, but $V_{th}$ changes to a large extent, resulting in reduction of a long-term reliability. meanwhile, if the first silicon nitride film 9 is thick, $V_{th}$ changes only to a small extent, but the off-current increases, which deteriorates the TFT characteristics. If this TFT is to be used as a load element of a 4-Mbit static random access memory (4M-SRAM), the standby current must be about 0.4 $\mu$A or less. The fact that the standby current is 0.4 $\mu$A or less corresponds to the fact that the off-current of TFT is 100 fA or less. Since the service voltage of 4M-SRAM is 4 to 5V, it is necessary to suppress the change of $V_{th}$, caused by the BT stress within 0.5V in order to ensure the required long-term reliability. The off-current must be smaller than the above value in view of the case where the memory capacity is further increased, because the current consumption at the standby state cannot be increased due to conditions such as limitation of a battery capacity. Further, there has been a tendency to reduce the service voltage, so that the degree of change of $V_{th}$ cannot be increased.

Accordingly, it is apparent from FIG. 3 that the first silicon nitride film 9 having the thickness in the range from 50 to 150 Å satisfies both of the restrictions that the off-current must be 100 fA or less and that the change of $V_{th}$, must be suppressed within 0.5 V.

Although the first silicon nitride film has the function which satisfies both the electric characteristics and the reliability as described above, it causes the following disadvantage. The coefficient of thermal expansion of the first silicon nitride film 9 is larger than those of a silicon oxide film and a silicon thin film formed by thermal oxidation, and a remarkably large internal stress generates in the film. Therefore, if the first silicon nitride film 9 were in contact directly with the channel polysilicon layer 5, the stress would be applied to polysilicon in the channel polysilicon layer 5 to cause distortion of crystallinity, resulting in increase of the off-current of TFT. Further, the interface between the silicon and the silicon nitride film contains more dangling bonds than the interface between the silicon and the silicon oxide film. This also forms a factor increasing the off-current.

Therefore, the embodiment shown in FIG. 1 overcomes the foregoing disadvantages by interposing the second silicon oxide film 8 between the first silicon nitride film 9 and the channel polysilicon layer 5. This second silicon oxide film 8 relieves or reduces the stress applied from the first silicon nitride film 9 and also improves the characteristics of the interface by covering the surface of the channel polysilicon layer 5 with the silicon oxide film.

Figure 4:
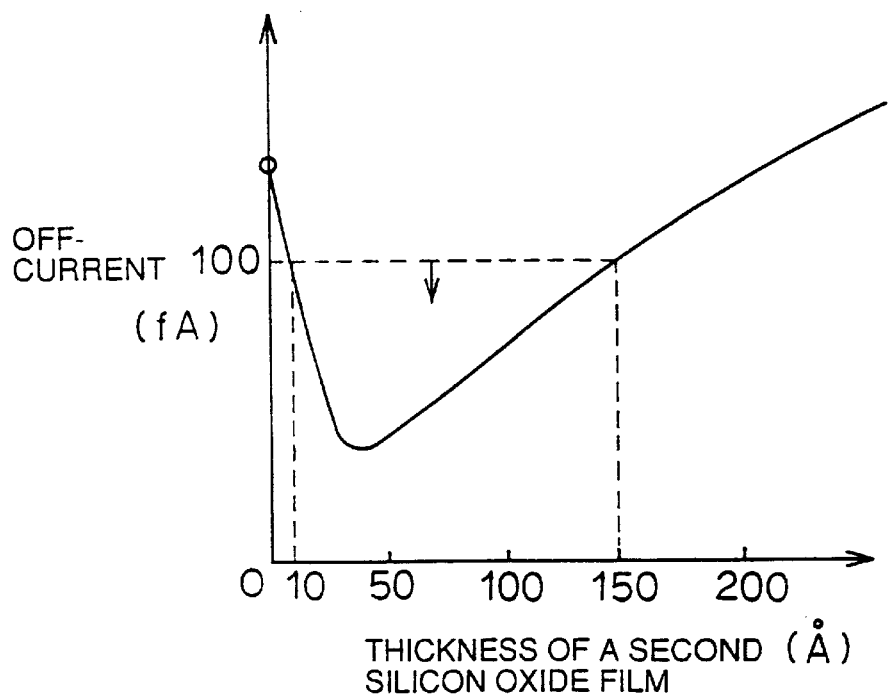
FIG. 4 shows a relationship between a thickness of a second silicon oxide film and an off-current.
Figure 5:
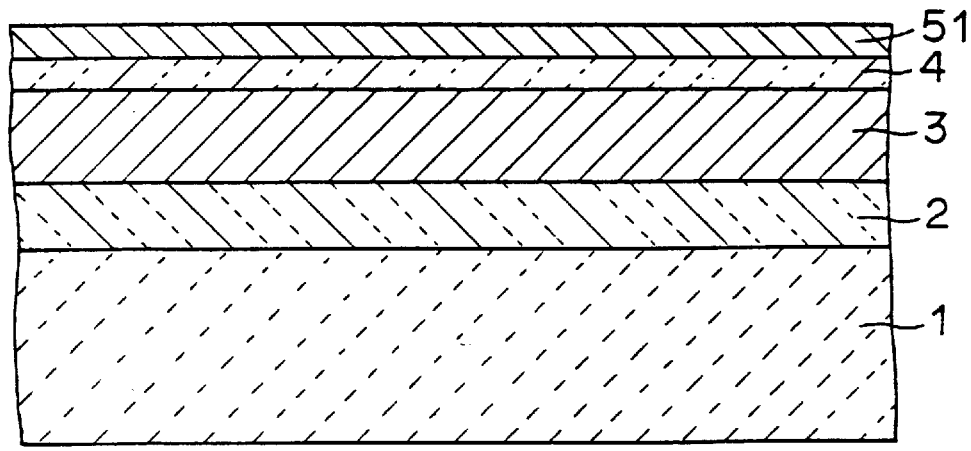
FIGS. 5–8 are cross sections of a semiconductor device at 1st to 4th steps in a method of manufacturing the thin-film transistor of the embodiment of the invention, respectively.
Figure 6:
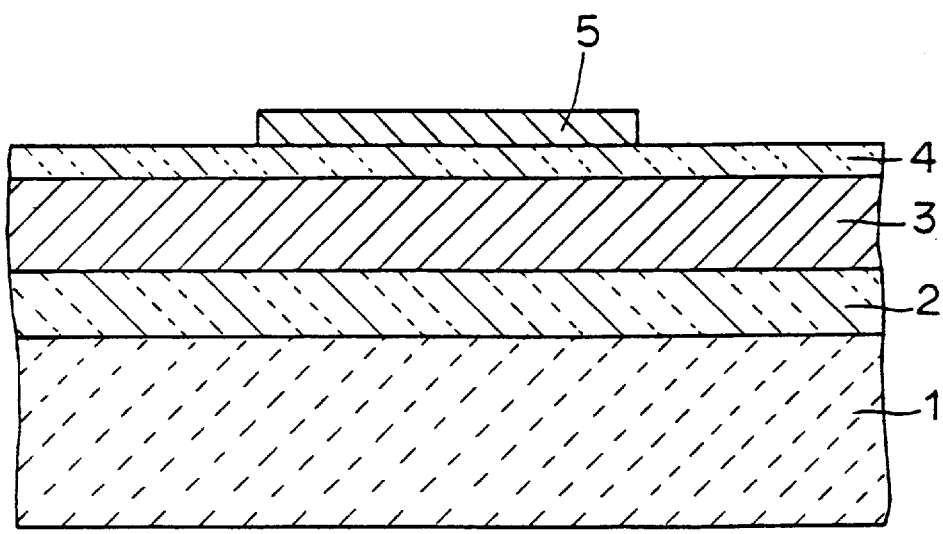

Then, the thickness of the second silicon oxide film 8 will be described more in detail with reference to FIG. 4. In order to relieve the stress applied from the first silicon nitride film 9, a larger thickness of the second silicon oxide film. is preferable. Meanwhile, the silicon oxide film generally contains a large number of oxygen atoms and silicon atoms having dangling bonds, so that they serve as hydrogen traps to catch and fix the hydrogen atoms diffusing into the film. Therefore, a diffusion coefficient of hydrogen in the silicon oxide film is small, although it is not as small as that in the silicon nitride film. Therefore, if the second silicon oxide film 8 were remarkably thick, hydrogen in the second silicon nitride film 7 would be prevented from diffusing into the TFT and thus the hydrogenating effect would be reduced, resulting in increase of the off-current. The thickness of the second silicon oxide film 8 and the off-current has the relationship shown in FIG. 4 and represented by a downwardly convex curve having a minimum value. If the off-current of the TFT is be set to 100 fA or less, it is required to set the thickness of the second silicon oxide film 8 within a range from 10 to 150 Å as shown in FIG. 4.

The second silicon oxide film 8 can be formed by either the CVD method or the thermal oxidation method. In the CVD method, $N_2$, and $SiH_4$ are chemically reacted on each other at a temperature of 20 to 900° C. under a normal pressure or vacuum state to deposit an $SiO_2$ film. In the thermal oxidation method, oxidizing gas such as $O_2$ or $H_2O$ is used at a temperature of 700 to 1100° C. to oxidize the surface of the semiconductor layer 5 for forming a thermally oxidized film thereat.

Between the foregoing two methods, the method utilizing the thermal oxidation is superior because of the following reason. Thermal oxidation effected on the polysilicon improves the crystallinity of polysilicon, resulting in reduction of the off-current. This has been experimentally ascertained. During the thermal oxidation, interstitial silicon atoms emitted from the interface between the silicon and the thermally oxidized film enter the polysilicon to reduce the number of holes forming defects in the polysilicon, whereby the crystallinity is improved.

The thermal oxidation consumes polysilicon at the surface of the semiconductor layer, which reduces the thickness of the semiconductor layer and thus reduces an area of PN junction at a drain end where the off-current generates. This also reduces the off-current.

While the CVD method uses two kinds of gases, the thermal oxidizing method uses one kind of gas and is effected under the normal pressure. Therefore, a reaction speed of the thermal oxidizing method depends on less parameters than that of the CVD method. As a result, the thermal oxidizing method is superior to the CVD method in controllability of the film thickness and the reproducibility.

Then, a method of manufacturing the thin-film transistor shown in FIG. 1 will be described below. FIGS. 5–8 are fragmentary cross sections of the semiconductor device at different steps in the method of manufacturing the thin-film transistor shown in FIG. 1. For sake of illustration, the following description will be made with reference to the cross sections taken along line IV—IV in FIG. 2, Referring to FIG. 5, the insulating film 2 is formed on the substrate 1. The gate electrode 3 made of polysilicon is formed on the insulating film 2. The gate insulating film 4 is formed on the gate electrode 3. The gate insulating film 4 is made of the silicon oxide film. A polysilicon film 51 of 0.005 to 1 μm in thickness is formed on the gate insulating film 4 by the CVD method executed at a temperature of 400 to 700° C. This polysilicon film 51 is processed by photolithography and etching technique to form the channel polysilicon layer 5 of the transistor.

Figure 7:
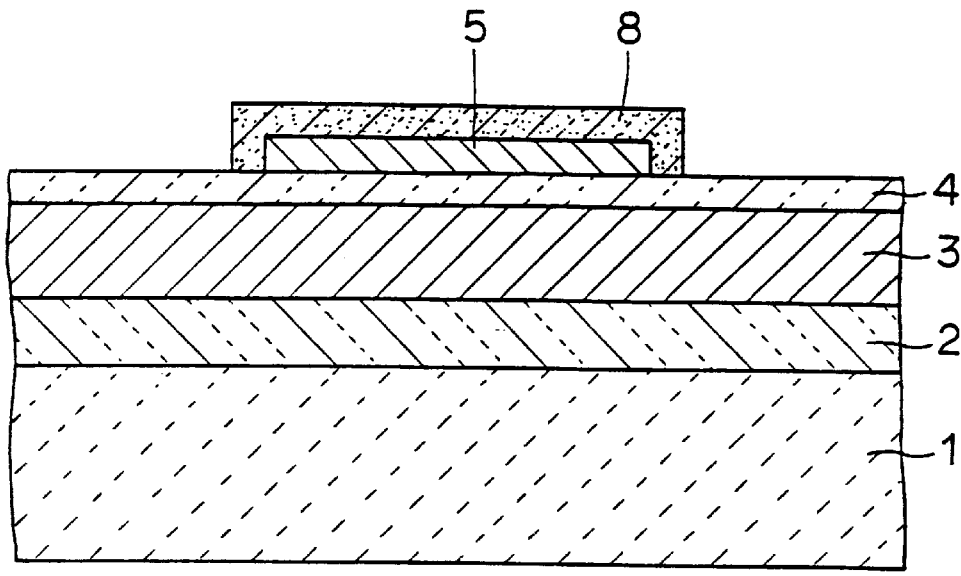

Referring to FIG. 7, thermal oxidation is executed at a temperature of 700 to 1100° C. to form the second silicon oxide film 8 of 10 to 150 Å in thickness on the surface of the channel polysilicon layer 5.

Figure 8:
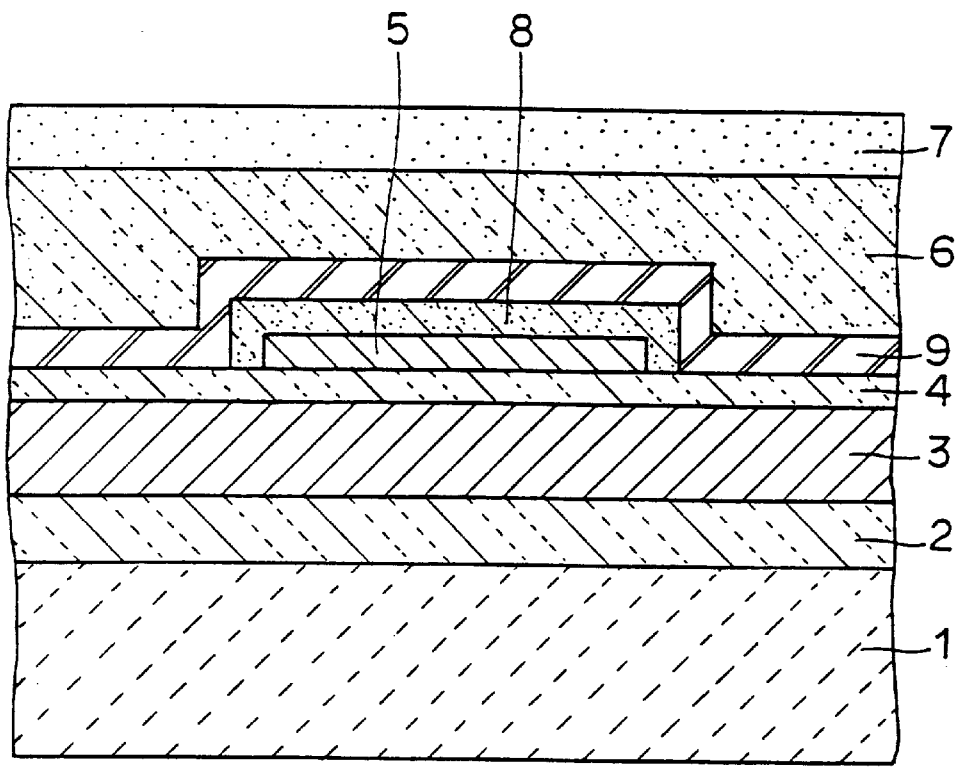

Referring to FIG. 8, the first silicon nitride film 9 of 50 to 150 Å in thickness is deposited on the second silicon oxide film 8 by the LPCVD method at a temperature of 700 to 800° C. The first silicon oxide film 6 of 0.1 to 2 μm in thickness is deposited on the first silicon nitride film 9 by CVD method at a temperature from the room temperature to 500° C. Thereafter, the second silicon nitride film 7 is deposited on the first silicon oxide film 6 by the plasma CVD method. Thereafter, annealing processing is carried out, whereby the thin-film transistor is completed.

Embodiment 2

Figure 9:
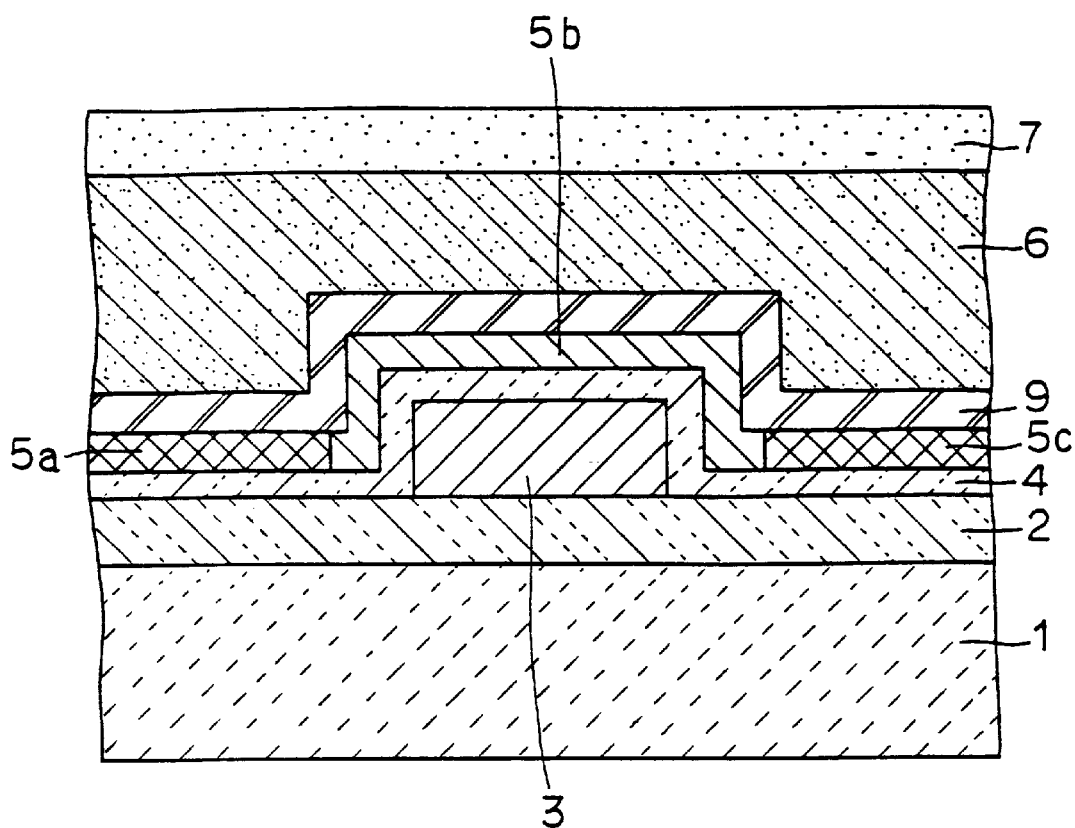
FIG. 9 is a cross section of a thin-film transistor of a second embodiment of the invention.

In the embodiment 1, there has been exemplified a case where the second silicon oxide film 8 is formed in addition to the first silicon nitride film 9. Referring to FIG. 9, however, the first interlayer silicon nitride film 9 may be formed on the channel polysilicon layer 5. This structure can control likewise the quantity of hydrogen atoms moving from the second silicon nitride film 7 into the channel polysilicon layer 5.

Embodiment 3

Figure 10:
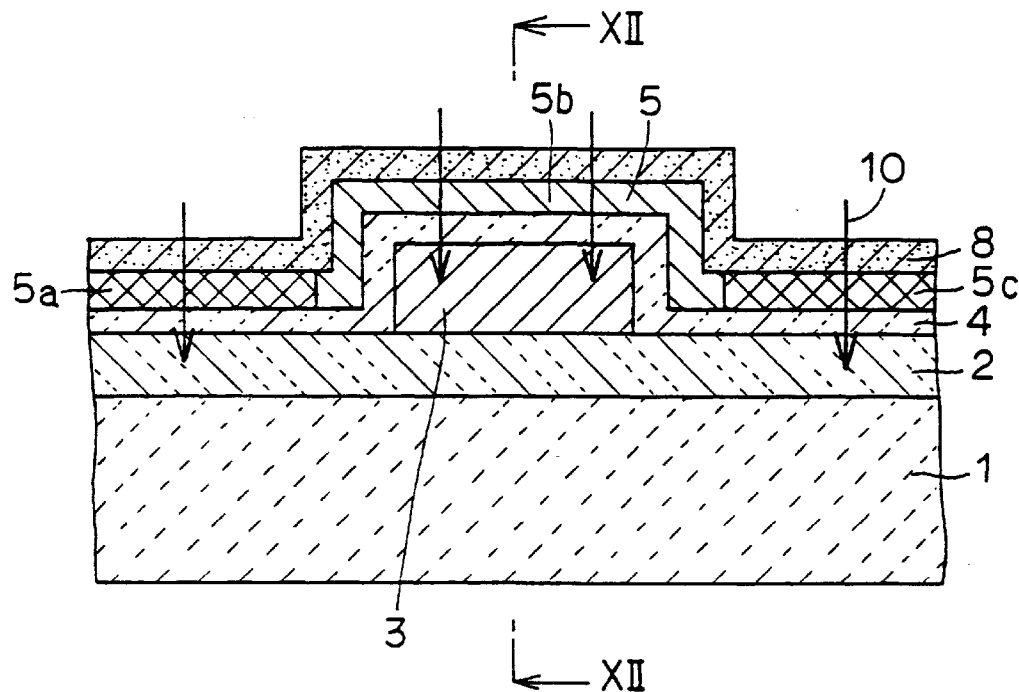
FIGS. 10 and 11 are cross sections of a semiconductor devices at 1st and 2nd steps in a method of manufacturing a thin-film transistor of a third embodiment of the invention, respectively.
Figure 11:
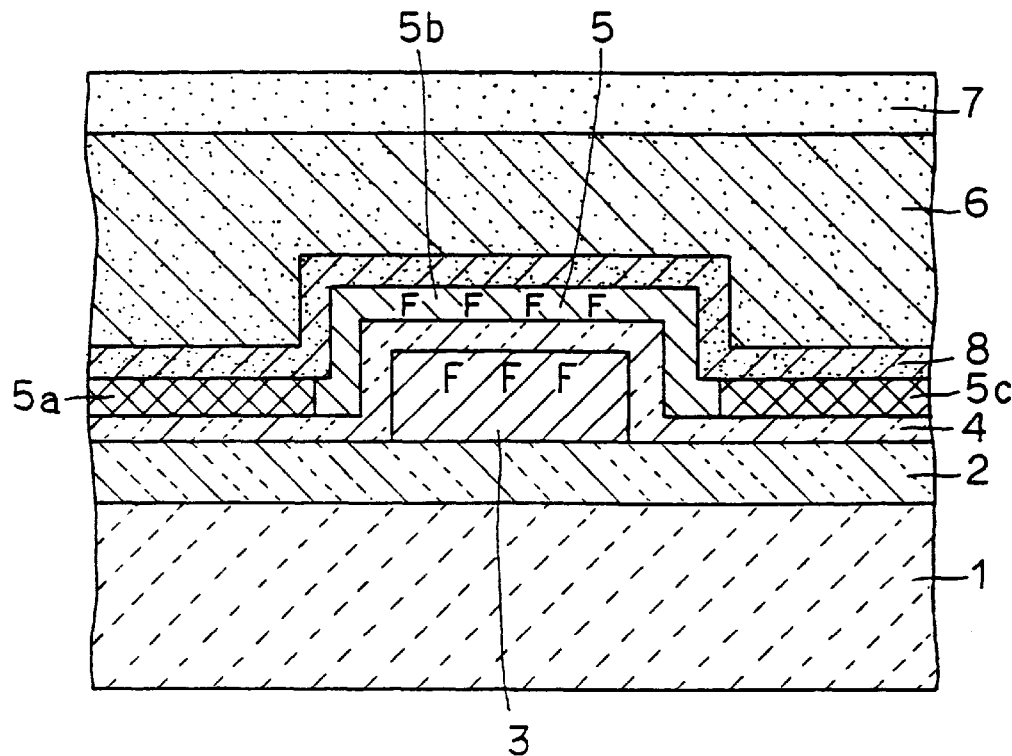

FIGS. 10 and 11 are cross sections showing a method of manufacturing the thin-film transistor of a third embodiment. Referring to FIG. 10, the insulating film 2 is formed on the substrate 1. The gate electrode 3 is formed on the insulating film 2. The gate oxide film 4 is formed to cover the surface of the gate electrode 3. The channel polysilicon layer 5 is formed on the substrate 1 to cover the gate electrode 3 with the gate oxide film 4 therebetween. The active layer 5b forming the channel as well as the source region 5a and drain region 5c located at the opposite sides of the active layer 5b are formed at the channel polysilicon layer 5.

The second silicon oxide film 8 is formed on the substrate to cover the channel polysilicon layer 5. Thereafter, fluorine 10 is implanted in such a manner that an implanting position is located at the interior of the gate electrode 3. For example, it is assumed that the gate electrode 3 has a thickness of 1500 Å, the gate oxide film 4 has a thickness of 300 Å, a channel polysilicon layer 5 has a thickness of 400 Å and a second silicon oxide film 8 has a thickness of 200 Å. In this case, if the fluorine is implanted with an acceleration energy of 90 KeV, nearly all the fluorine can be introduced into the gate electrode 3. The implantation dose is in a range from about $1 \times 10^{14}$ to $1 \times 10^{16} cm^{-2}$. If the implantation dose is less than $1 \times 10^{14} cm^{-2}$, the characteristics cannot be improved sufficiently. If the implantation dose is more than $1 \times 10^{16} cm^{-2}$, damage reaches up to the channel polysilicon layer 5.

Figure 12:
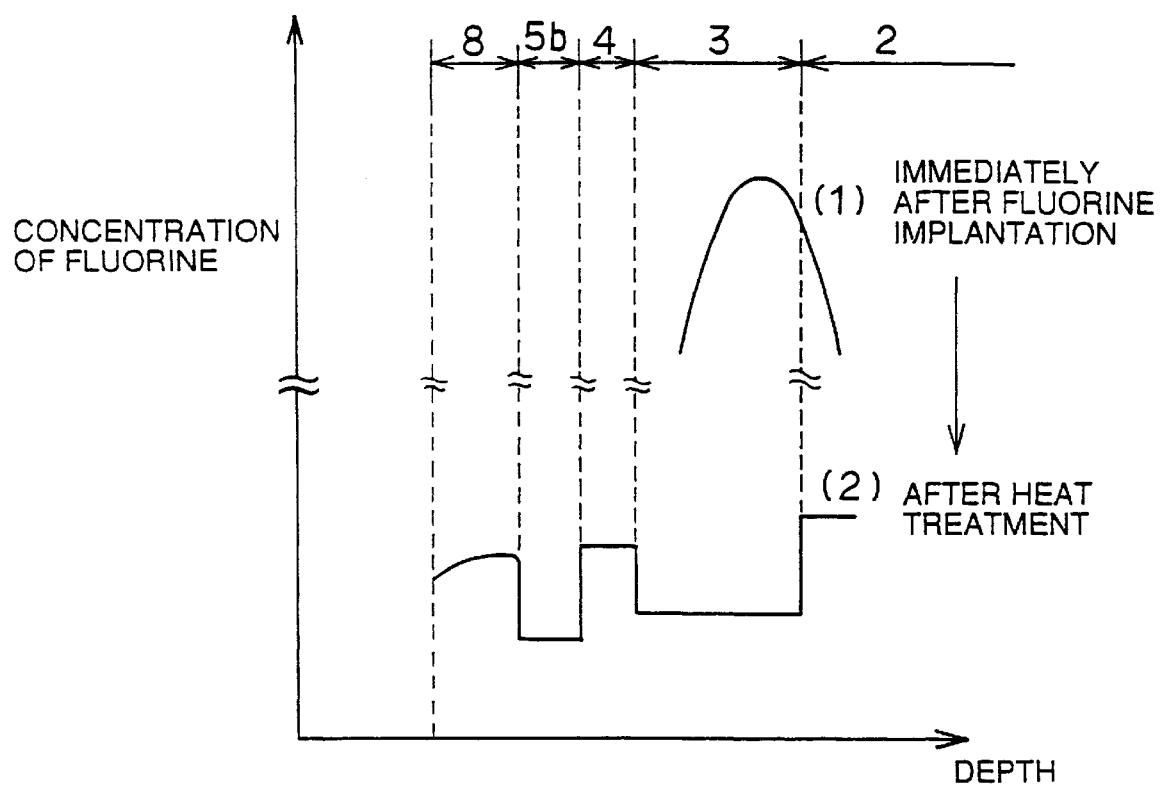
FIG. 12 shows distribution of fluorine in the thin-film transistor.

A profile of fluorine immediately after the implantation of fluorine is shown in FIG. 12. Curve (1) represents the profile of density of fluorine immediately after the implantation of fluorine. The profile of fluorine is represented on the cross section taken along line XII—XII in FIG. 10.

Referring to FIG. 11, the first silicon oxide film (BPSG film) serving as a flattening film of about 4000 Å in thickness is deposited on the second silicon oxide film 8. Thereafter, heat treatment at the temperature of 850° C. is carried out for about 30 minutes to flatten the surface of the first silicon oxide film 6. During this processing, the fluorine implanted into the gate electrode 3 diffuses and reaches up to the channel polysilicon layer 5, so that it seals dangling bonds in the channel polysilicon layer, and Si—F bonds generate as a result. Curve (2) in FIG. 12 represents a profile of fluorine after the heat treatment. Although the quantity of fluorine contained in the active layer 5b is smaller than that of fluorine contained in the gate polysilicon layer 3, it is certain that fluorine is present in the active layer 5b.

Thereafter, referring to FIG. 11, the plasma CVD method is used to deposit the second silicon nitride film 7 on the first silicon oxide film 6. The second silicon nitride film 7 functions as the passivation film for protecting the TFT from external moisture and contamination. The second silicon nitride film 7 emits hydrogen contained therein during formation thereof. The emitted hydrogen reaches up to the channel polysilicon layer 5 and acts to seal the dangling bonds of silicon in the channel polysilicon layer 5. However, a large amount of dangling bonds have already been sealed with fluorine, so that only a small number of dangling bonds are sealed with hydrogen. Therefore, the quantity of Si—H bonds thus produced is small, and thus shift of $V_{th}$ by the BT stress is suppressed.

Since the total number of the dangling bonds in the channel polysilicon layer 5 is small due to the sealing with fluorine and hydrogen as described above, the electric characteristics of the TFT are improved. Introduction of fluorine into the channel polysilicon layer 5 can improve both the reliability and the initial electric characteristics.

As can be understood from curve (2) in FIG. 12, the density of fluorine contained in the channel polysilicon layer 5b is smaller than that of fluorine contained in the gate electrode 3. However, by increasing the implantation dose of fluorine, the density of fluorine in the channel polysilicon layer 5 can be increased.

In connection with the above embodiment, it has been exemplified that fluorine is implanted after forming the second silicon oxide film 8. However, fluorine may be implanted immediately after forming the gate electrode 3, or after forming the gate insulating film 4 or channel polysilicon layer 5. The important point in this embodiment is that fluorine is implanted into the gate electrode 3, and thereafter the fluorine in the gate electrode is diffused into the channel polysilicon layer 5.

Although Kitazima et al has disclosed in *Extended Abstracts of* 1991 *I.C.S.S.D.M.*, p. 174 the method of implanting fluorine into the vicinity of the channel polysilicon layer, this method destroys the channel polysilicon layer. The foregoing embodiment has improved this method.

Embodiment 4

Figure 13:
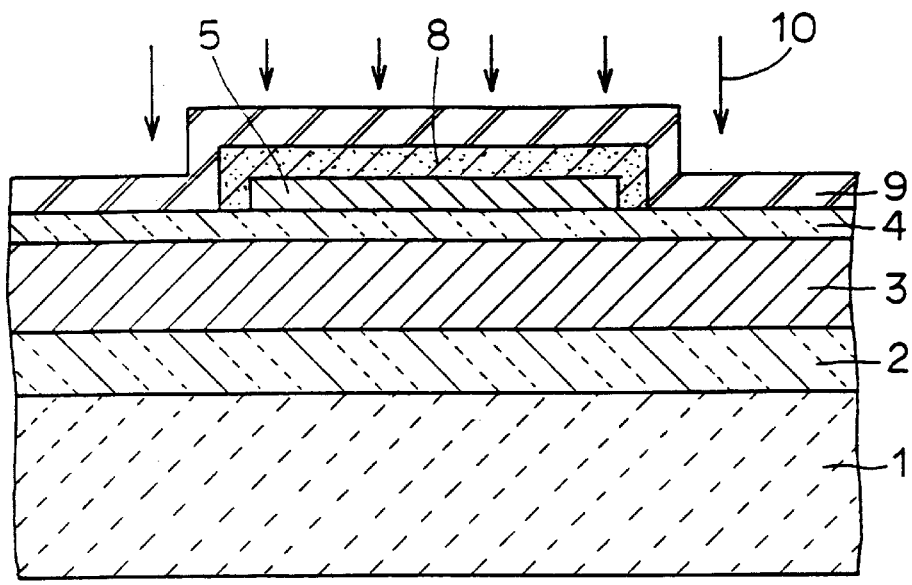
FIG. 13 is a cross section corresponding to that taken along line IV—IV in FIG. 2 and showing a semiconductor device at a 1st step in a method of manufacturing the thin-film transistor of a fourth embodiment.
Figure 14:
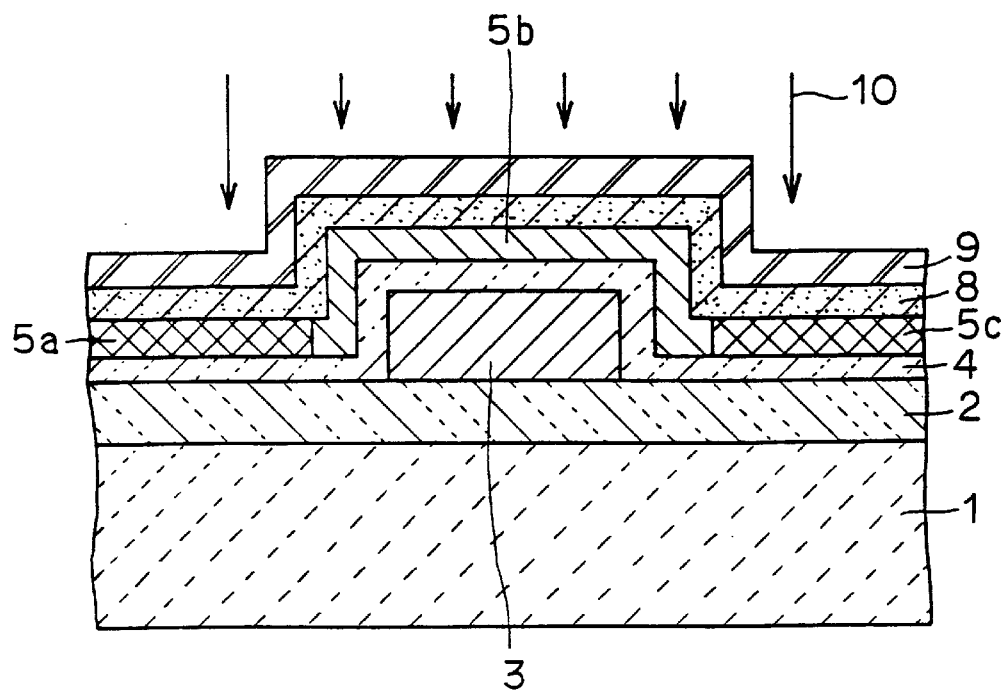
FIGS. 14 and 15 are cross sections corresponding to that taken along line I—I in FIG. 2 and showing the semiconductor device at 1st and 2nd steps in the method of manufacturing the thin-film transistor of the fourth embodiment.
Figure 15:
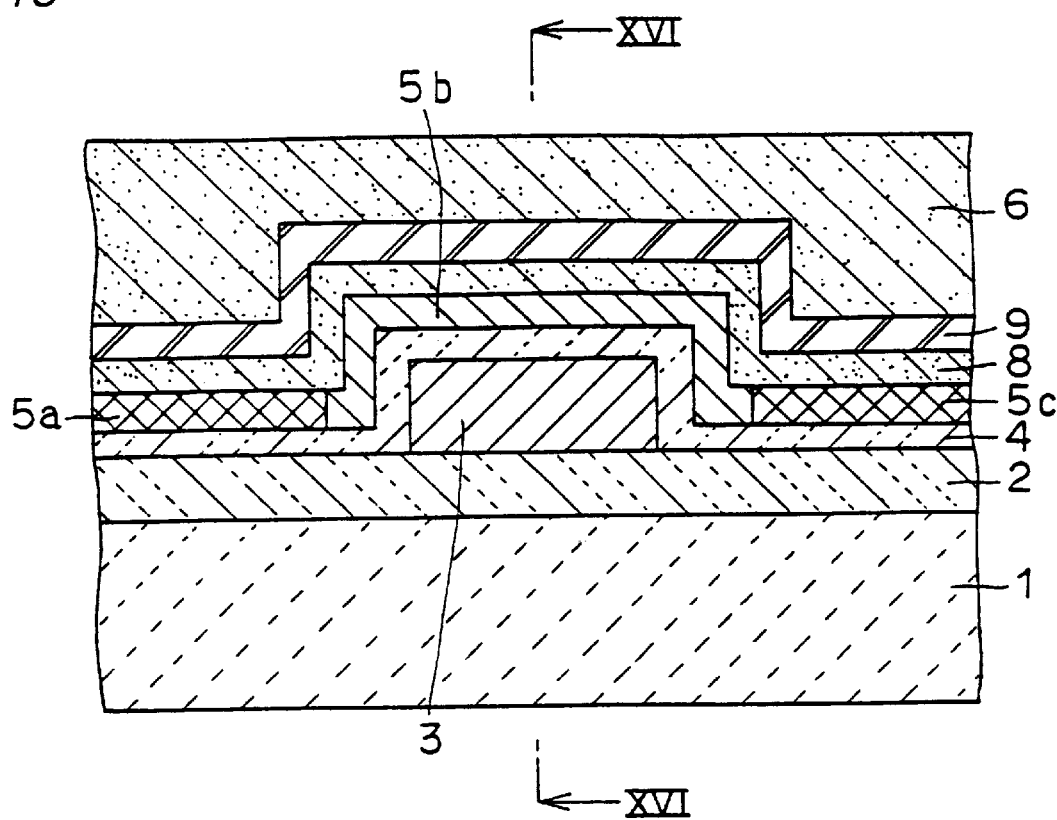

FIGS. 13–15 are cross sections of the semiconductor device showing a method of manufacturing the thin-film transistor of an embodiment 4.

Referring to FIGS. 13 and 14 which are cross sections taken along lines IV—IV and I–I in FIG. 2, respectively, one forms on the substrate 1 the insulating film 2, gate electrode 3, gate oxide film 4, channel polysilicon layer 5 and second silicon oxide film 8. Thereafter, the first silicon nitride film 9 of 100 Å in thickness is formed on the substrate 1 to cover the second silicon oxide film 8 by the LPCVD method at a temperature of 700° C. to 800° C. Fluorine is implanted downwardly at a density of $1 \times 10^{15} cm^{-2}$ with an energy of 20 KeV, whereby fluorine is implanted into the channel polysilicon layer 5.

Referring to FIG. 15, the first silicon oxide film 6, which contains boron and phosphorus, is formed on the first silicon nitride film 9, and then heat treatment (reflow) is effected at a temperature of 850° C. to flatten the surface of the first silicon oxide film 6. Owing to this heat treatment for flattening, the fluorine 10 implanted into the channel polysilicon layer 5 seals the dangling bonds of silicon in the channel polysilicon layer 5, resulting in improvement of the electric characteristics of TFT. Also, this heat treatment diffuses the fluorine.

Figure 16:
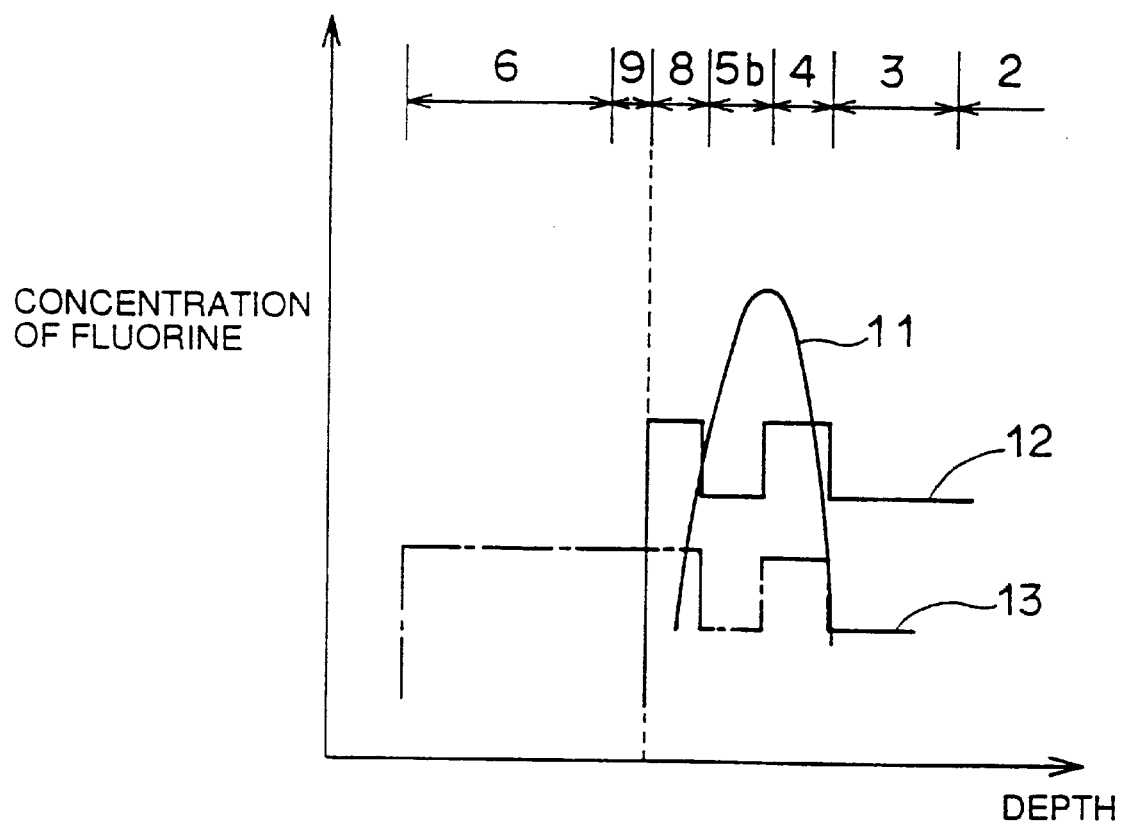
FIG. 16 shows distribution of fluorine in the thin-film transistor of the fourth embodiment of the invention.

FIG. 16 shows a state of diffusion of fluorine. In FIG. 16, curve 11 represents distribution of the fluorine immediately after implantation of fluorine, curve 12 represents distribution of the fluorine after reflow in the case where the first silicon nitride film 9 exists, and curve 13 represents distribution of the fluorine after reflow in the case where the first silicon nitride film 9 does not exist. The diagram of FIG. 16 showing fluorine distribution represents profiles of fluorine in a section taken along line A—A in FIG. 15.

Immediately after implantation of fluorine, as can be seen from curve 11 in FIG. 16, fluorine distributes in an upwardly convex form according to a mechanism of ion implantation. As can be seen from curves 12 and 13, when the heat treatment is effected, fluorine concentrates at the silicon oxide films (4 and 8) rather than at the polysilicon (5b and 3). As can be seen from curve 13, if the interlayer silicon nitride film 9 does not exist, fluorine escapes into the first silicon oxide film 6, so that the density of fluorine decreases as a whole. In order to increase the density of fluorine, more fluorine must be implanted, in which case damage by the implantation increases. However, by disposing the first silicon nitride film 9, which is dense enough to prevent pass of fluorine, at the upper portion of the TFT, fluorine is prevented from diffusing upwardly as can be seen from curve 12, so that a large amount of fluorine remains in the channel polysilicon layer 5. As a result, the quantity of fluorine to be implanted can be reduced by an amount corresponding to that of fluorine escaping into the first silicon oxide film 6, and thereby, it is possible to minimize damage, i.e., destruction of crystallinity of polysilicon, which may be caused to the channel polysilicon layer 5 by implantation of fluorine.

Embodiment 5

Figure 17:
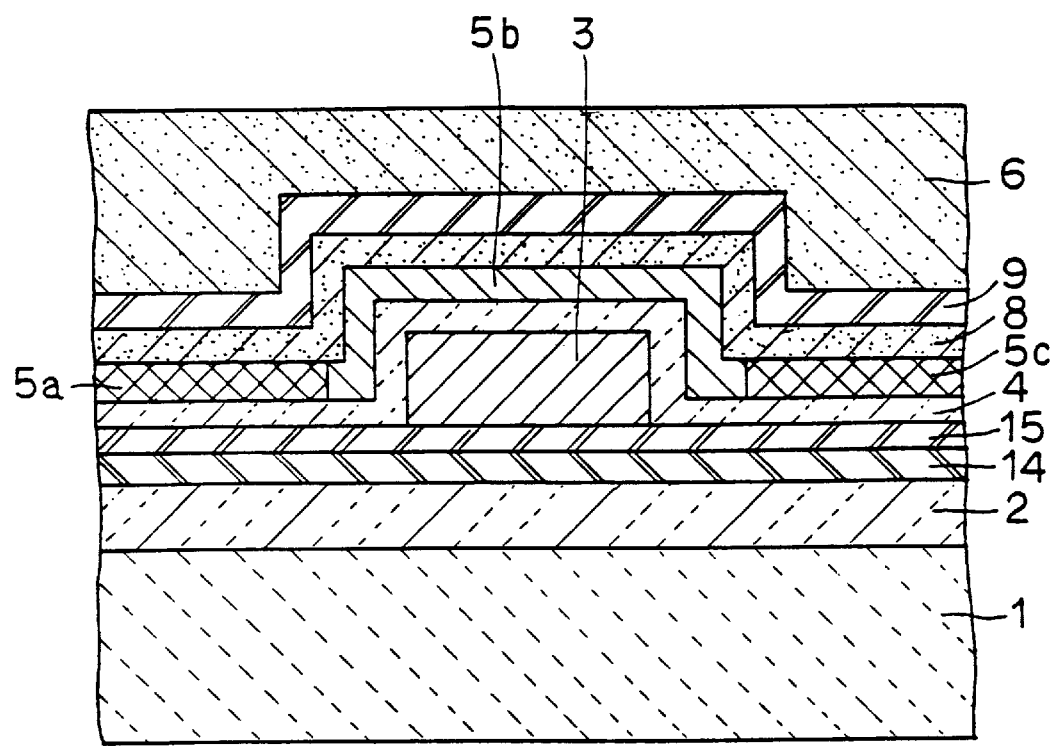
FIG. 17 is a cross section of a thin-film transistor of a fifth embodiment of the invention.

FIG. 17 is a cross section of a thin-film transistor of an embodiment 5. This embodiment has such a distinctive feature that a third silicon nitride film 15 of 100 Å in thickness and a third silicon oxide film 14 of 500 Å in thickness are disposed under the gate electrode 3 of the TFT.

As already described in connection with the embodiment 1, the first silicon nitride film 9 prevents upward escape of the implanted fluorine. In the embodiment 1, however, fluorine wastefully escapes downward. Owing to provision of the third silicon nitride film 15 under the gate electrode 3, downward diffusion of fluorine is suppressed, which further improves a utilization efficiency of fluorine implanted into the channel polysilicon layer (5b).

In the embodiment described above, the third silicon oxide film 15 is interposed between the gate electrode 3 and the third interlayer silicon nitride film 14. The reason for providing the third silicon oxide film 15 is as follows. In the case where the gate electrode is formed of polysilicon and where the base is the silicon nitride film, the selection ratio of dry etching of the polysilicon and silicon nitride film is small. Therefore, if the third silicon oxide film 15 were not present, the etching would be effected up to the third silicon nitride film 14 at the lower position and the third silicon nitride film 14 would be removed during processing of the gate electrode. The third silicon oxide film 15 prevents the foregoing disadvantage. Therefore, in the case where the gate electrode is made of material of a large section ratio of etching, the third silicon oxide film 15 is not required.

Embodiment 6

This embodiment has been developed to overcome the above disadvantage. As already described, introduction of fluorine into the TFT improves the on-current ($V_g$=−3V) and off-current ($V_g$=0V) of the TFT and also positively shifts $V_{th}$ in the I–V characteristics. It can be considered that these effects are attained by formation of fixed negative charges in the gate oxide film (P. J. Wrights, *IEEE Transaction on Electron Devices*, Vol. 36, No. 5, 1989).

Figure 18:
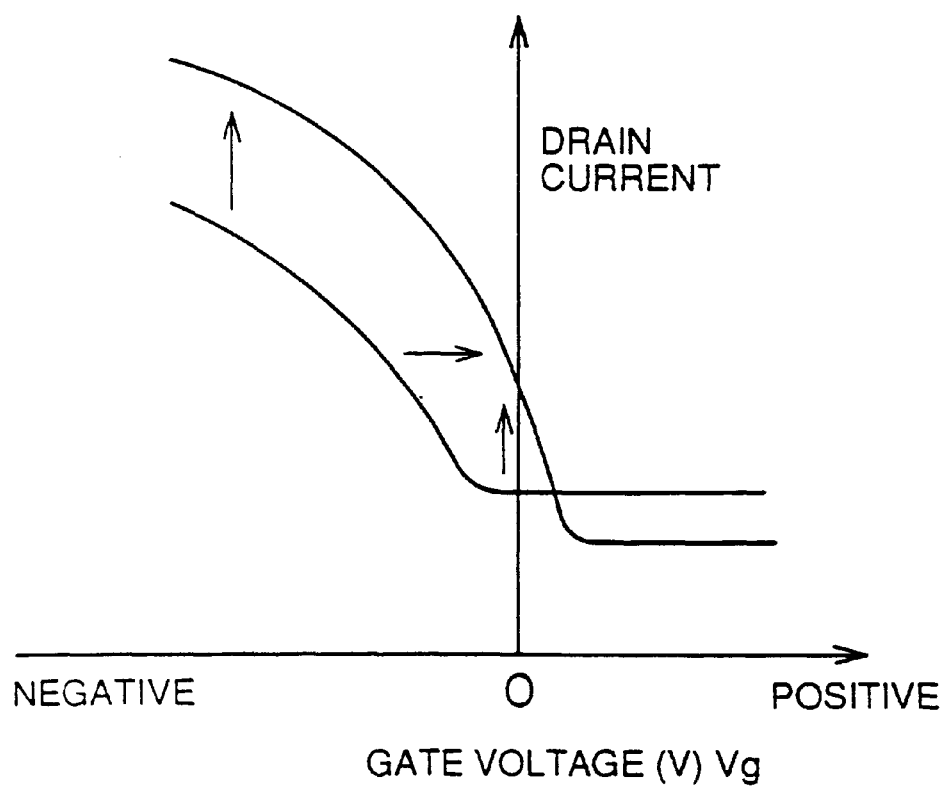
FIG. 18 shows a relationship between a gate voltage and a drain current.

If an excessively large amount of fluorine is introduced to reduce the off-current, $V_{th}$ positively shifts to a large extent as shown in FIG. 18. Consequently, $V_{th}$ enters the sub-threshold region if the gate voltage is 0V. In this case, although the leak current is small at the gate voltage of a positive value, the drain current is excessively large at the gate voltage of 0V. The embodiment 6 can be effectively utilized in order to lower only the off-current for avoiding this disadvantage. This embodiment does not affect adversely the reliability relating to the BT stress and others.

Figure 19:
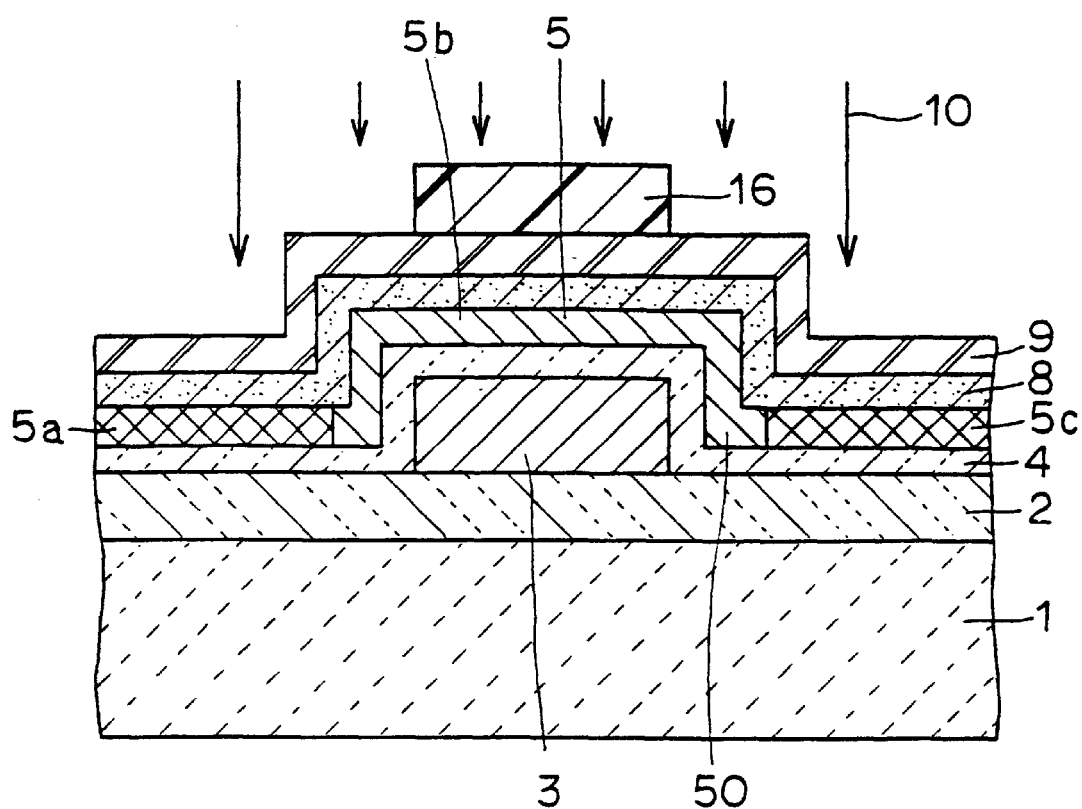
FIG. 19 is a cross section showing a method of manufacturing a thin-film transistor of a sixth embodiment of the invention.

This embodiment has such a distinctive feature that implantation of fluorine into the channel portion, which may cause shift of $V_{th}$, is not executed but fluorine is implanted into the drain end where the off-current generates. The implantation of fluorine into the drain end can be executed, as shown in FIG. 19, by providing a resist 16 on the channel region (5B) and implanting the fluorine using the resist 16 as a mask. The implantation of fluorine is executed under appropriate conditions that the energy is in a range from 60 KeV to 100 KeV so as to prevent damage against the channel polysilicon layer 5. The resist 16 must have a thickness enough to prevent pass of fluorine, but does not require the thickness in excess of 1 μm. The preferable implantation dose of fluorine is in a range from $1\times10^{14}$ to $1\times10^{16}$ cm$^{-2}$.

The fluorine diffuses into the drain end 50 of the channel polysilicon layer 5 by virtue of a later step for depositing the insulating film or flattening the surface by heat treatment. The diffused fluorine seals dangling bonds of silicon and thereby reduces the off-current.

Embodiment 7

Figure 20:
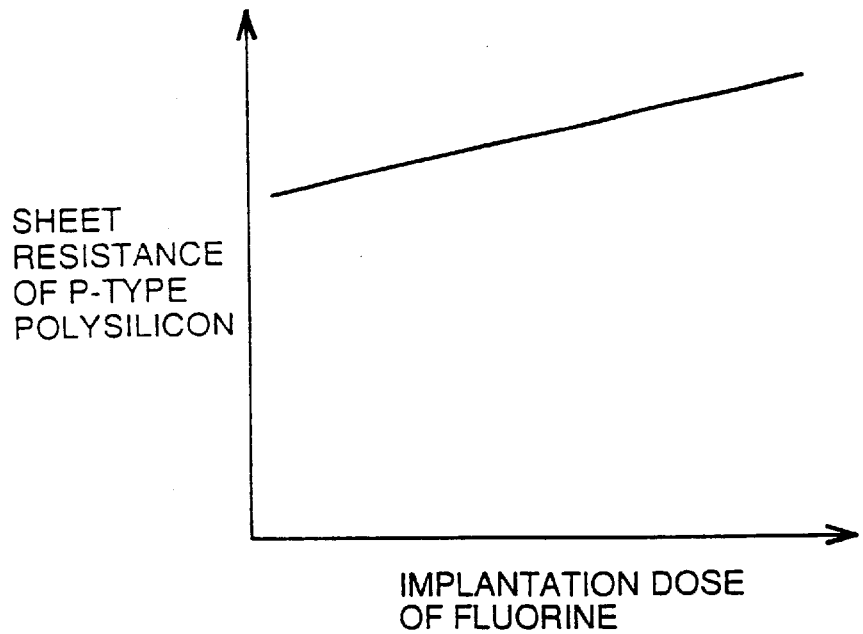
FIG. 20 shows a relationship between an implantation dose of fluorine and a sheet resistance of P-type polysilicon.

Implantation of fluorine into the TFT causes the following disadvantage. Referring to FIG. 20, introduction of fluorine increases a sheet resistance of P-type polysilicon containing boron implanted thereinto. The reason of this is considered as that the introduced fluorine bonds to boron in the polysilicon to deactivate the boron. In the P-channel TFT, since source/drain contain boron introduced thereinto, the polysilicon is of the P-type. Therefore, if it were merely extended for using the same as an interconnection, the interconnection resistance would be large, which would cause delay of transmission of electric signals and/or voltage drop. These disadvantages can be effectively overcome by the manufacturing method of the embodiment 7.

Figure 21:
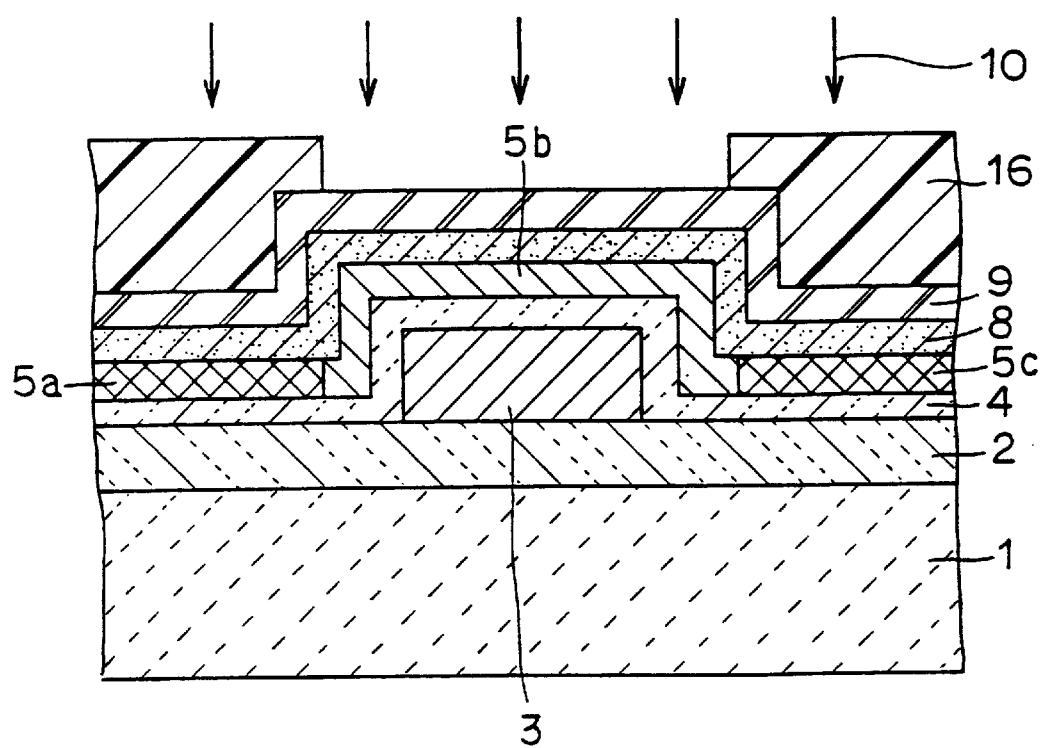
FIG. 21 is a cross section showing the method of manufacturing the thin-film transistor of the sixth embodiment of the invention.
Figure 22:
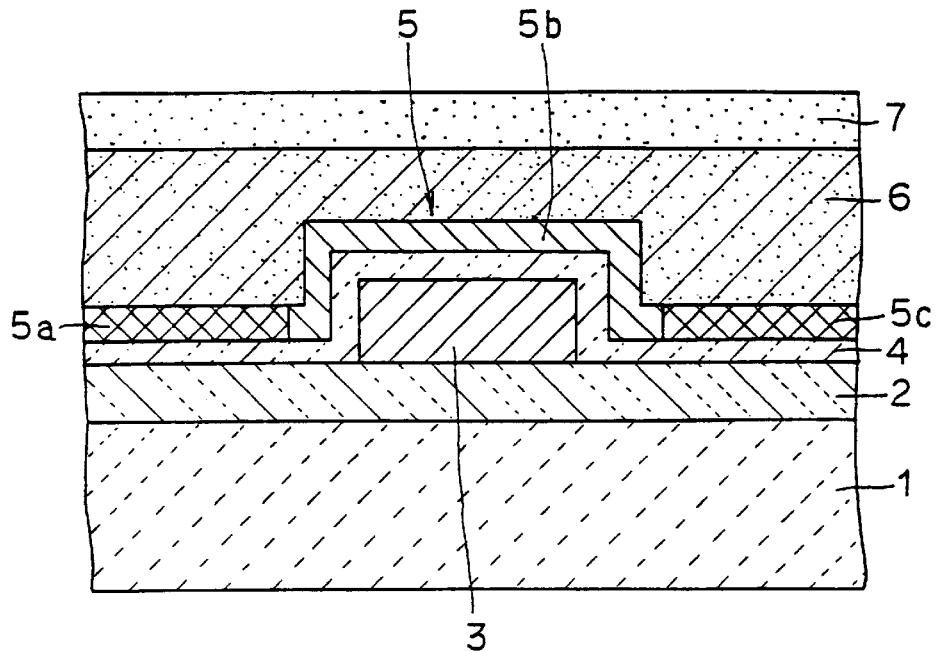
FIG. 22 is a cross section of a conventional thin-film transistor.
Figure 23:
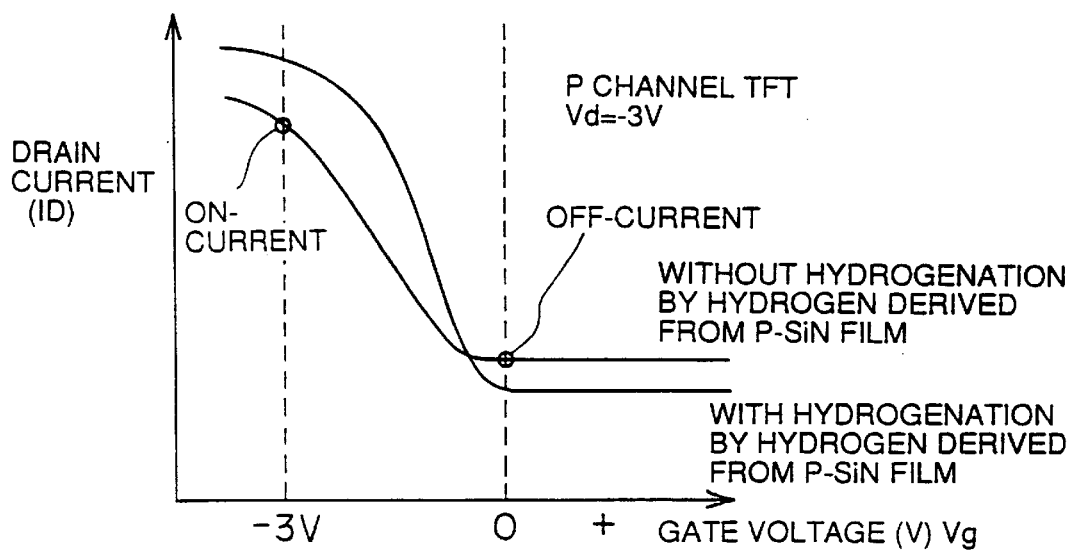
FIG. 23 shows a relationship between a gate voltage and a drain current.
Figure 24:
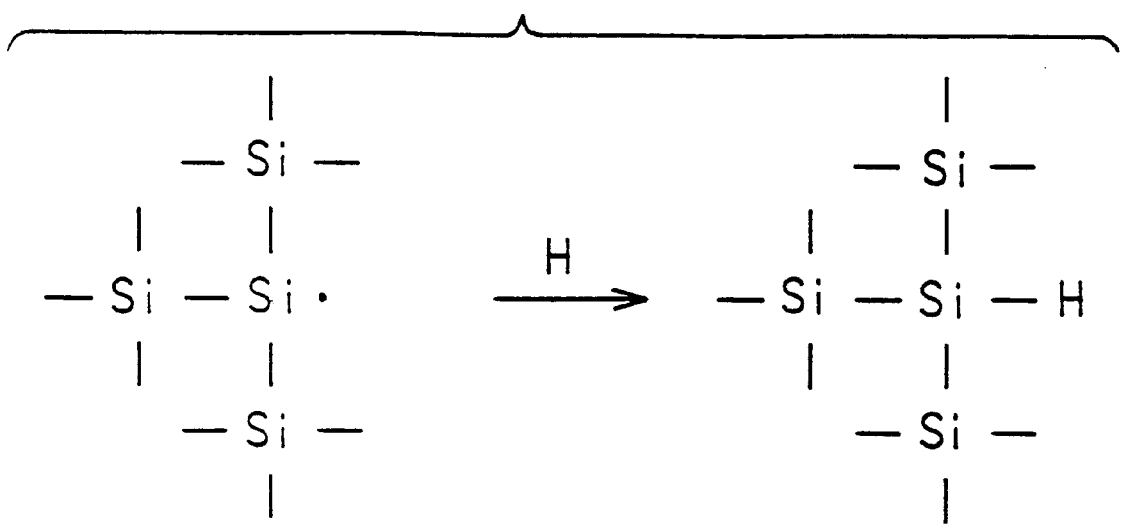
FIG. 24 shows a reaction formula representing sealing of a dangling bond with hydrogen.
Figure 25:
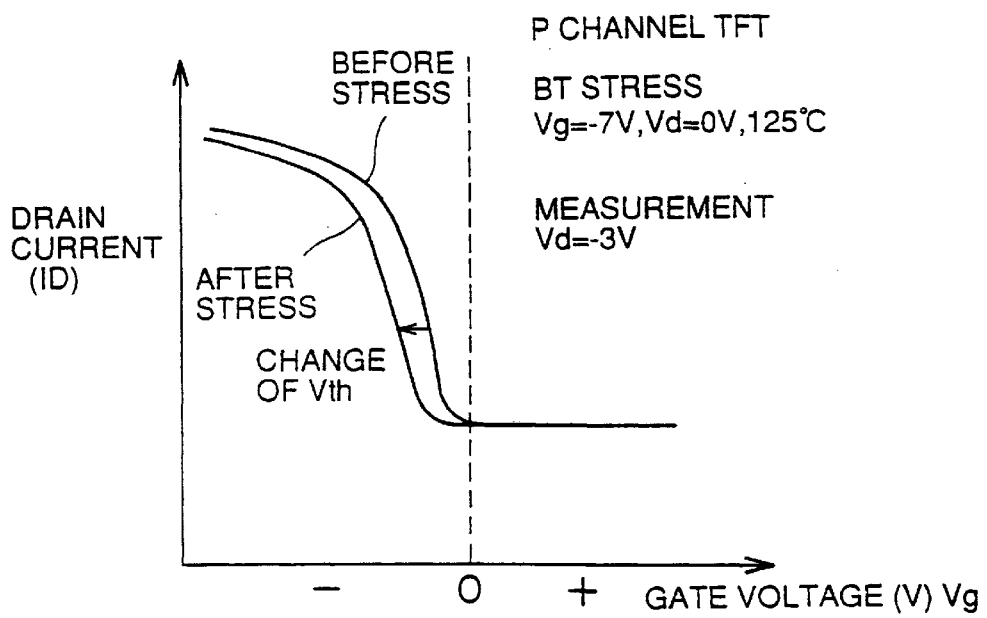
FIG. 25 shows a relationship between a gate voltage and a drain current.
Figure 26:
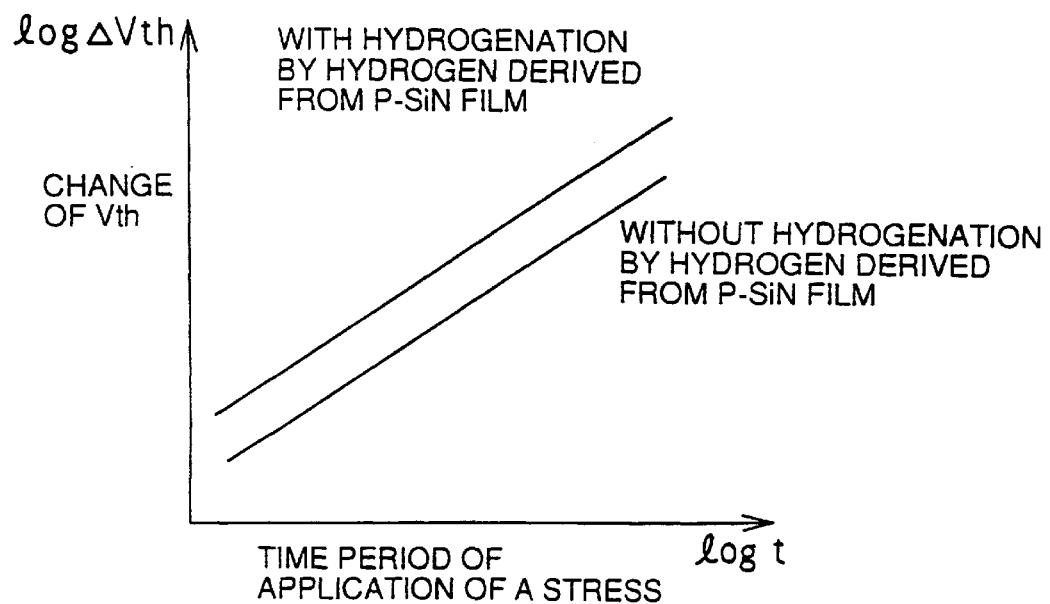
FIG. 26 shows a relationship between a time period of application of a stress and change of $V_{th}$.

Referring to FIG. 21, the resist 16 having a thickness not allowing pass of fluorine is provided at each extended portion of the source/drain. Using the resist 16 as a mask, fluorine is implanted into the active layer 5b. By employing this method, fluorine is introduced into the TFT, and thereby electrical characteristics and reliability relating to the BT stress and others are improved as already described. Since the fluorine is not introduced into the source/drain formed of P-type polysilicon and the extended portions thereof, their sheet resistances do not increase. The conditions for implanting fluorine and the thickness of the resist are the same as those of the embodiment 6.

According to the thin-film transistor of the first aspect of the invention, as described hereinbefore, the quantity of hydrogen contained in the first silicon nitride film is smaller than that of hydrogen contained in the second silicon nitride film. This first silicon nitride film is formed by the LPCVD method, and the second silicon nitride film is formed by the plasma CVD method. In contrast to the plasma silicon nitride film, the silicon nitride film formed by the LPCVD method has such a property that it contains scarcely any hydrogen atom and does not easily pass the hydrogen atom therethrough. Therefore, even if the hydrogen contained in the second silicon nitride film moves toward the active layer, the hydrogen is interrupted by the first silicon nitride film, so that the quantity of hydrogen entering the active layer is controlled. As a result, the thin-film transistor can have a preferable feature that both the off-current and the change of $V_{th}$ are small.

According to the thin-film transistor of the second aspect of the invention, the quantity of fluorine contained in the active layer is smaller than that of fluorine contained in the gate electrode. This structure is formed by implanting the fluorine into the gate electrode and then thermally diffusing the implanted fluorine into the active layer. In other words, the foregoing structure is not formed by the direct implantation of fluorine into the active layer. Therefore, no damage is caused to the active layer. Further, the dangling bonds of silicon in the active layer are sealed with the fluorine thus diffused, so that the Si—H bond does not generate even if hydrogen diffuses toward the active layer thereafter. As a result, the thin-film transistor can suppresses the shift of $V_{th}$ caused by the BT stress.

According to the thin-film transistor of the third aspect of the invention, since the fluorine is implanted into the portion of the active layer near the drain region, the dangling bonds of silicon at the drain end of the active layer are sealed. As a result, the off-current of the thin-film transistor can be small.

According to the method of manufacturing the thin-film transistor of the fourth aspect of the invention, the first silicon nitride film is formed on the semiconductor layer by the LPCVD method. The silicon nitride film formed by the LPCVD method contains scarcely any hydrogen atom and does not easily pass the hydrogen atom therethrough. Therefore, even if the hydrogen contained in the second silicon nitride film moves toward the active layer, the hydrogen is interrupted by the first silicon nitride film, so that the quantity of hydrogen entering the active layer is controlled. As a result, the preferable thin-film transistor can be obtained in which both the off-current and the change of V$th$ are small.

According to the method of manufacturing the thin-film transistor of the fifth aspect of the invention, the fluorine is implanted into the gate electrode, and then the gate electrode containing the fluorine is thermally processed to diffuse the fluorine into the active layer. Since the fluorine is not implanted directly into the active layer, the active layer containing fluorine can be obtained without damaging the active layer. As a result, the thin-film transistor having a high long-term reliability can be obtained without deteriorating the characteristics.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a thin-film transistor comprising the steps of:

forming a gate electrode on a substrate;

forming a gate insulating film on said substrate to cover said gate electrode;

forming an active layer forming a channel on said gate insulating film;

implanting fluorine into said gate electrode; and thermally processing said gate electrode into which said fluorine is implanted to diffuse said fluorine into said active layer.

2. The method according to claim 1 further comprising the step of forming a silicon nitride film on said semiconductor layer by a low-pressure chemical vapor deposition method after forming said semiconductor layer and before implanting said fluorine.

* * * * *